United States Patent
Oh et al.

(10) Patent No.: US 11,444,135 B2
(45) Date of Patent: Sep. 13, 2022

(54) ORGANIC LIGHT EMITTING DISPLAY HAVING TOUCH SENSOR AND METHOD OF FABRICATING THE SAME

(71) Applicant: LG Display Co., Ltd., Seoul (KR)

(72) Inventors: Jae-Young Oh, Goyang-si (KR); Min-Joo Kim, Seoul (KR); Jae-Won Lee, Goyang-si (KR); Eun-Hye Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/063,456

(22) Filed: Oct. 5, 2020

(65) Prior Publication Data

US 2021/0020703 A1 Jan. 21, 2021

Related U.S. Application Data

(63) Continuation of application No. 16/410,749, filed on May 13, 2019, now Pat. No. 10,825,873, which is a
(Continued)

(30) Foreign Application Priority Data

Aug. 31, 2016 (KR) ......................... 10-2016-0112193

(51) Int. Cl.
*G06F 3/041* (2006.01)
*H01L 27/32* (2006.01)
(Continued)

(52) U.S. Cl.
CPC .......... *H01L 27/323* (2013.01); *G06F 3/0412* (2013.01); *H01L 27/3258* (2013.01);
(Continued)

(58) Field of Classification Search
CPC ...... G06F 3/041; G06F 3/0416; G06F 3/0412; G06F 2203/04103; H01L 27/323
See application file for complete search history.

(56) References Cited

U.S. PATENT DOCUMENTS 9,158,425 B2 10/2015 Peng et al.
2014/0078100 A1 3/2014 Peng et al.
(Continued)

FOREIGN PATENT DOCUMENTS

CN 103872070 A 6/2014
CN 105470406 A 4/2016
(Continued)

OTHER PUBLICATIONS

European Extended Search Report, European Application No. 17184397.2, dated Feb. 9, 2018, 5 pages.
(Continued)

*Primary Examiner* — Dennis P Joseph
(74) *Attorney, Agent, or Firm* — Fenwick & West LLP

(57) ABSTRACT

Disclosed are an organic light emitting display having a touch sensor, which may achieve process simplification and cost reduction, and a method of fabricating the same. The organic light emitting display includes a compensation film having a flat surface and formed to cover dams forming a boundary with an organic encapsulation layer and the compensation film has a planarized surface between a region above the dams and a boundary region between the dams and the organic encapsulation layer (144) and may prevent cut and short-circuit of routing lines cutting across the same. Further, touch sensors are disposed on an encapsulation unit including the organic encapsulation layer and thus a separate attachment process is not required, thereby simplifying the overall process and reducing manufacturing costs of the organic light emitting display.

15 Claims, 15 Drawing Sheets

Related U.S. Application Data continuation of application No. 15/621,988, filed on Jun. 13, 2017, now Pat. No. 10,340,317.

(51) Int. Cl.
*H01L 51/52* (2006.01)
*H01L 51/56* (2006.01)

(52) U.S. Cl.
CPC .......... *H01L 51/5253* (2013.01); *H01L 51/56* (2013.01); *G06F 2203/04103* (2013.01); *H01L 27/3244* (2013.01)

(56) References Cited

U.S. PATENT DOCUMENTS

| | | |
|---|---|---|
| 2014/0117316 A1 | 5/2014 | Choi |
| 2014/0145979 A1 | 5/2014 | Lee |
| 2015/0060806 A1 | 3/2015 | Park et al. |
| 2015/0253924 A1 | 9/2015 | Park et al. |
| 2016/0126498 A1 | 5/2016 | Kim |
| 2016/0315284 A1 | 10/2016 | Jeon |
| 2017/0179432 A1 | 6/2017 | Visweswaran et al. |
| 2018/0032189 A1 | 2/2018 | Lee et al. |
| 2018/0033832 A1 | 2/2018 | Park et al. |
| 2018/0046221 A1* | 2/2018 | Choi .................. G02B 26/0825 |

FOREIGN PATENT DOCUMENTS

| | | |
|---|---|---|
| CN | 107665911 A | 2/2018 |
| EP | 3001479 A1 | 3/2016 |
| EP | 3276460 A1 | 1/2018 |
| KR | 10-2016-0032800 A | 3/2016 |
| KR | 10-2016-0037496 A | 4/2016 |
| TW | 1465986 B | 12/2014 |
| TW | 1466001 B | 12/2014 |

OTHER PUBLICATIONS

European Office Action, European Patent Application No. 17184397.2, dated Mar. 26, 2019, 4 pages.
Korean Office Action, Korean Application No. 10-2016-0112193, dated Mar. 21, 2017, 6 pages (with concise explanation of relevance).
Taiwan Intellectual Property Office, Office Action, TW Patent Application No. 106127279, dated Oct. 23, 2018, six pages.
United States Office Action, U.S. Appl. No. 15/621,988, dated Sep. 26, 2018, 21 pages.
United States Office Action, U.S. Appl. No. 15/621,988, dated Jul. 6, 2018, 17 pages.
United States Office Action, U.S. Appl. No. 16/410,749, dated Mar. 18, 2020, 17 pages.

* cited by examiner

ORGANIC LIGHT EMITTING DISPLAY HAVING TOUCH SENSOR AND METHOD OF FABRICATING THE SAME

CROSS-REFERENCE TO RELATED APPLICATIONS

This application is a continuation of U.S. patent application Ser. No. 16/410,749 filed on May 13, 2019 which is a continuation of U.S. patent application Ser. No. 15/621,988 filed on Jun. 13, 2017 which claims the benefit of Korean Patent Application No. 10-2016-0112193, filed on Aug. 31, 2016, each of which is incorporated by reference in its entirety.

BACKGROUND

Field of Technology

The present disclosure relates to an organic light emitting display having a touch sensor and a method of fabricating the same, and more particularly, to an organic light emitting display having a touch senor which may achieve process simplification and cost reduction, and a method of fabricating the same.

Discussion of the Related Art

A touchscreen is an input device through which a user may input a command by selecting instructions displayed on a screen of a display using a hand or an object. That is, the touchscreen converts a contact position directly contacting a human hand or an object into an electrical signal and receives instructions selected at the contact position as an input signal. Such a touchscreen may substitute for a separate input device connected to a display and operated, such as a keyboard or a mouse, and thus applications of the touchscreen have gradually increased.

In general, a touchscreen is attached to the front surface of a display panel, such as a liquid crystal display panel or an organic electroluminescent display panel, through an adhesive. In this case, since the touchscreen is separately manufactured and then attached to the front surface of the display panel, an attachment process is additionally carried out and thus the overall process becomes complicated and manufacturing costs are raised.

SUMMARY

Accordingly, the present disclosure is directed to an organic light emitting display having a touch sensor and a method of fabricating the same that substantially obviate one or more problems due to limitations and disadvantages of the related art.

An object of the present disclosure is to provide an organic light emitting display having a touch sensor which may achieve process simplification and cost reduction, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The object is solved by the features of the independent claims. Various embodiments are given in the dependent claims.

To achieve these objects and other advantages and in accordance with the purpose of the invention, as embodied and broadly described herein, an organic light emitting display includes light emitting elements disposed on an active area of a substrate, an encapsulation unit disposed on the light emitting elements and including a plurality of inorganic encapsulation layers and at least one organic encapsulation layer disposed between the inorganic encapsulation layers, touch sensor disposed on the encapsulation unit, dams configured to surround the active area and to form a boundary with the at least one organic encapsulation layer, and a compensation film disposed to cover the dams and having different thicknesses between a region above the dams and a boundary region between the dams and the at least one organic encapsulation layer.

The compensation film may be realized as a stepped or staircase compensation having different thicknesses.

A plurality of color filters may be disposed between the touch sensor and the encapsulation unit to implement light of different colors, The compensation film is formed to have a monolayer or multilayer structure using the same material as at least one of the color filters.

A plurality of color filters disposed between the touch sensor and the encapsulation unit to implement light of different colors.

A black matrix is disposed between the color filters.

The compensation film includes a first compensation film layer formed of the same material as the black matrix; and a second compensation film layer formed of the same material as at least one of the color filters and disposed on the first compensation film layer.

A plurality of color filters is disposed between the touch sensor and the encapsulation unit to implement light of different colors; a black matrix disposed between the color filters; and a touch buffer film disposed between the color filters and the touch sensor, wherein the compensation film includes: a first compensation film layer formed of the same material as the black matrix; a second compensation film layer formed of the same material as at least one of the color filters and disposed on the first compensation film layer; and a third compensation film layer formed of the same material as the touch buffer film and disposed on the second compensation film layer.

A touch buffer film is disposed between the touch sensor and the encapsulation unit, wherein the compensation film is formed of the same material as the touch buffer film and is integrated with the touch buffer film.

The touch buffer film is formed of any one of acryl-based, epoxy-based and silane-based organic insulating materials.

A thickness of the compensation film in the region above the dams is less than a thickness of the compensation film in the boundary region.

Routing lines are connected to the touch sensor and intersecting or overlapping the dams with the compensation film interposed there between.

The routing lines are disposed in the boundary region and in the region above the dams being horizontally parallel with the boundary region.

Thin film transistors are connected to the light emitting elements.

A planarization film is disposed to cover the thin film transistors, wherein the routing lines are disposed in the region above the dams are disposed at a position higher than the upper surface of the planarization film.

The routing line covers a side surface of the compensation film.

The touch sensor includes a touch sensing line and a touch driving line intersecting each other The touch driving line comprises first touch electrodes connected to one another through a first bridge, The touch sensing line comprises second touch electrodes connected to one another through a second bridge.

At least one of the first and second touch electrodes comprises: a mesh metal layer have a mesh shaped pattern; and a transparent conductive layer located on or under the mesh metal layer.

At least one of the first and second bridges comprises a slit.

The slit of the at least one of the first and second bridges overlaps with the other one of the first and second bridges.

In another aspect of the disclosure an organic light emitting display is provided, comprising: light emitting elements disposed on an active area of a substrate; an encapsulation unit disposed on the light emitting elements and including at least one inorganic encapsulation layer and at least one organic encapsulation layer; a touch sensor disposed on the encapsulation unit; dams surrounding the active area and to form a boundary for the at least one organic encapsulation layer; a compensation film covering the dams, wherein the compensation film is provided between a touch pad and the at least one organic encapsulation layer and have different thicknesses in a region above the dams and in a boundary region between the dams and the at least one organic encapsulation layer.

The at least one inorganic encapsulation layer is provided on at least one of the dams.

The at least one inorganic encapsulation layer is contacting a protective film disposed on the substrate at least in the boundary region between the dams and the at least one organic encapsulation layer.

A touch protective film may cover the touch sensor.

The touch protective film is formed of one of an organic insulating material, a circularly polarizing plate, or a film formed of epoxy or acryl.

The routing lines are disposed in the boundary region and in the region above the dams on the same horizontal level.

A portion of the routing lines comprises a first and a second layer.

At least a portion of the first layer of the routing lines is covered by a pad cover electrode.

At least a portion of the first layer of the routing lines is made of the same material as one of the first and second bridges.

The pad cover electrode is made of the same material as the at least one touch electrode.

At least one of the first and second bridges is located corresponding to a bank for defining pixel areas.

The object is also solved by a method of fabricating an organic light emitting display comprising: forming light emitting elements disposed on an active area of a substrate and dams surrounding the active area; forming an encapsulation unit disposed on the light emitting elements and including a plurality of inorganic encapsulation layers and at least one organic encapsulation layer disposed between the inorganic encapsulation layers to form a boundary with the dams; forming a compensation film disposed to cover the dams and having different thicknesses between a region above the dams and a boundary region between the dams and the at least one organic encapsulation layer; and forming touch sensor disposed on the encapsulation unit.

The method further comprises forming a plurality of color filters disposed between the touch sensor and the encapsulation unit to implement light of different colors, wherein the compensation film is formed to have a monolayer or multilayer structure using the same material as at least one of the color filters.

The method further comprises forming a plurality of color filters disposed between the touch sensor and the encapsulation unit to implement light of different colors; and forming a black matrix disposed between the color filters, wherein the compensation film includes: a first compensation film layer formed of the same material as the black matrix; and a second compensation film layer formed of the same material as at least one of the color filters and disposed on the first compensation film layer.

The method further comprises forming a plurality of color filters disposed between the touch sensor and the encapsulation unit to implement light of different colors, forming a black matrix disposed between the color filters; and forming a touch buffer film disposed between the color filters and the touch sensor, wherein the compensation film includes: a first compensation film layer formed of the same material as the black matrix; a second compensation film layer formed of the same material as at least one of the color filters and disposed on the first compensation film layer; and a third compensation film layer formed of the same material as the touch buffer film and disposed on the second compensation film layer.

The method further comprises forming a touch buffer film disposed between the touch sensor and the encapsulation unit, wherein the compensation film is formed of the same material as the touch buffer film and is integrated with the touch buffer film.

The method further comprises forming routing lines connected to the touch sensor and intersecting the dams with the compensation film interposed there between, wherein the routing lines are disposed in the boundary region and in the region above the dams being horizontally parallel with the boundary region.

The method further comprises forming thin film transistors connected to the light emitting elements; and forming a planarization film disposed to cover the thin film transistors, wherein the routing lines disposed in the region above the dams are disposed at a position higher than the upper surface of the planarization film.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Reference will now be made in detail to various embodiments of the present disclosure, examples of which are illustrated in the accompanying drawings. Wherever possible, the same reference numbers will be used throughout the drawings to refer to the same or like parts.

Figure 1:
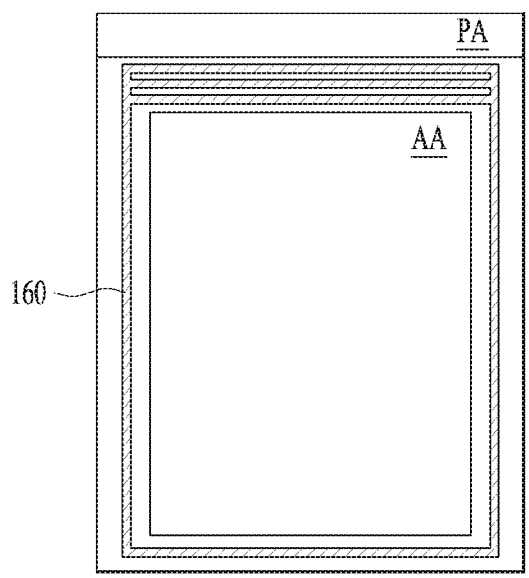
FIG. 1 is a plan view of an organic light emitting display having a touch sensor in accordance with one embodiment of the present disclosure.
Figure 2:
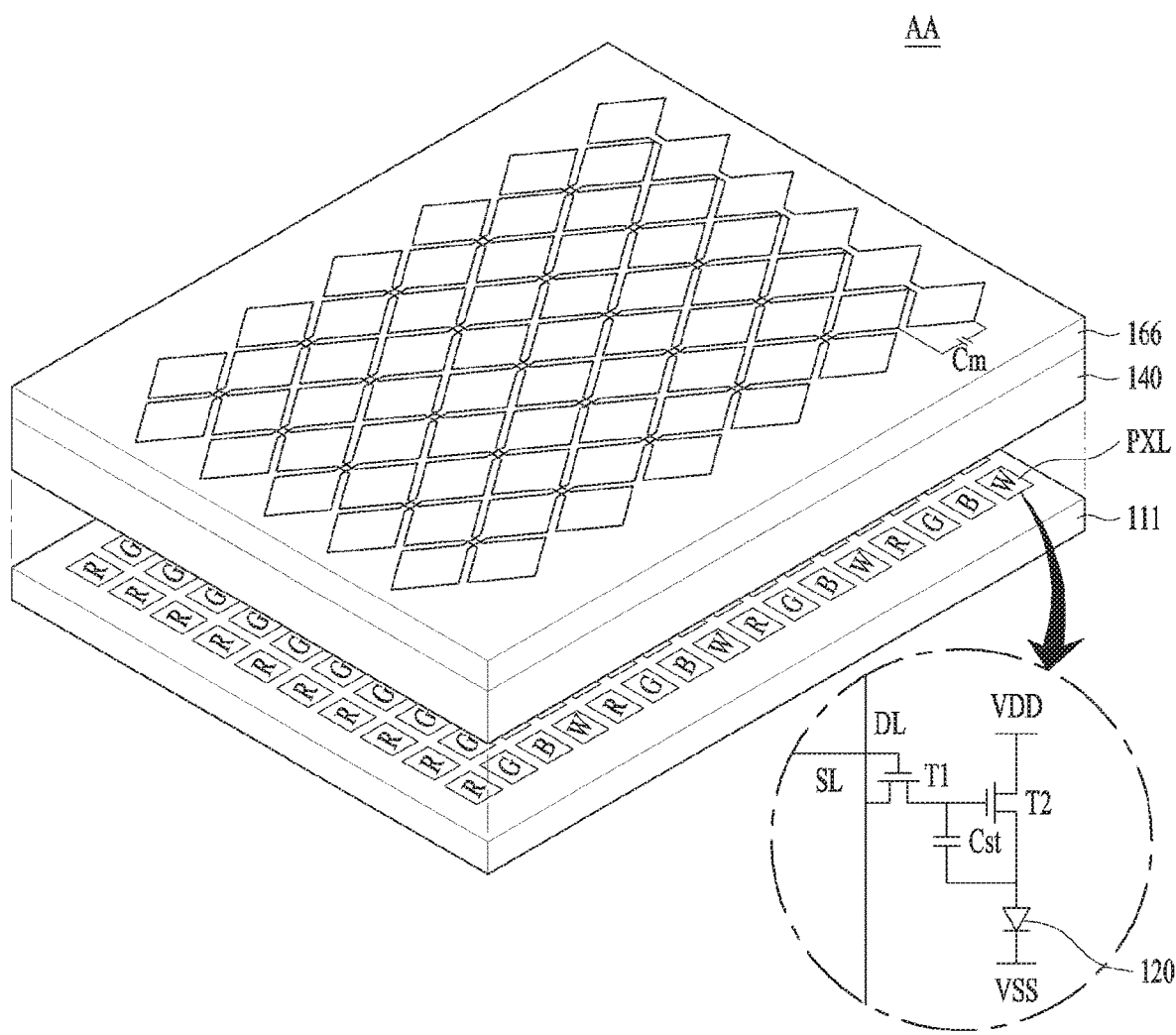
FIG. 2 is a perspective view illustrating an active area shown in FIG. 1 in accordance with one embodiment.

FIGS. 1 and 2 are plan and cross-sectional views of an organic light emitting display having a touch sensor in accordance with one embodiment of the present disclosure.

The organic light emitting display shown in FIGS. 1 and 2 has an active area AA and a pad area PA.

Figure 3:
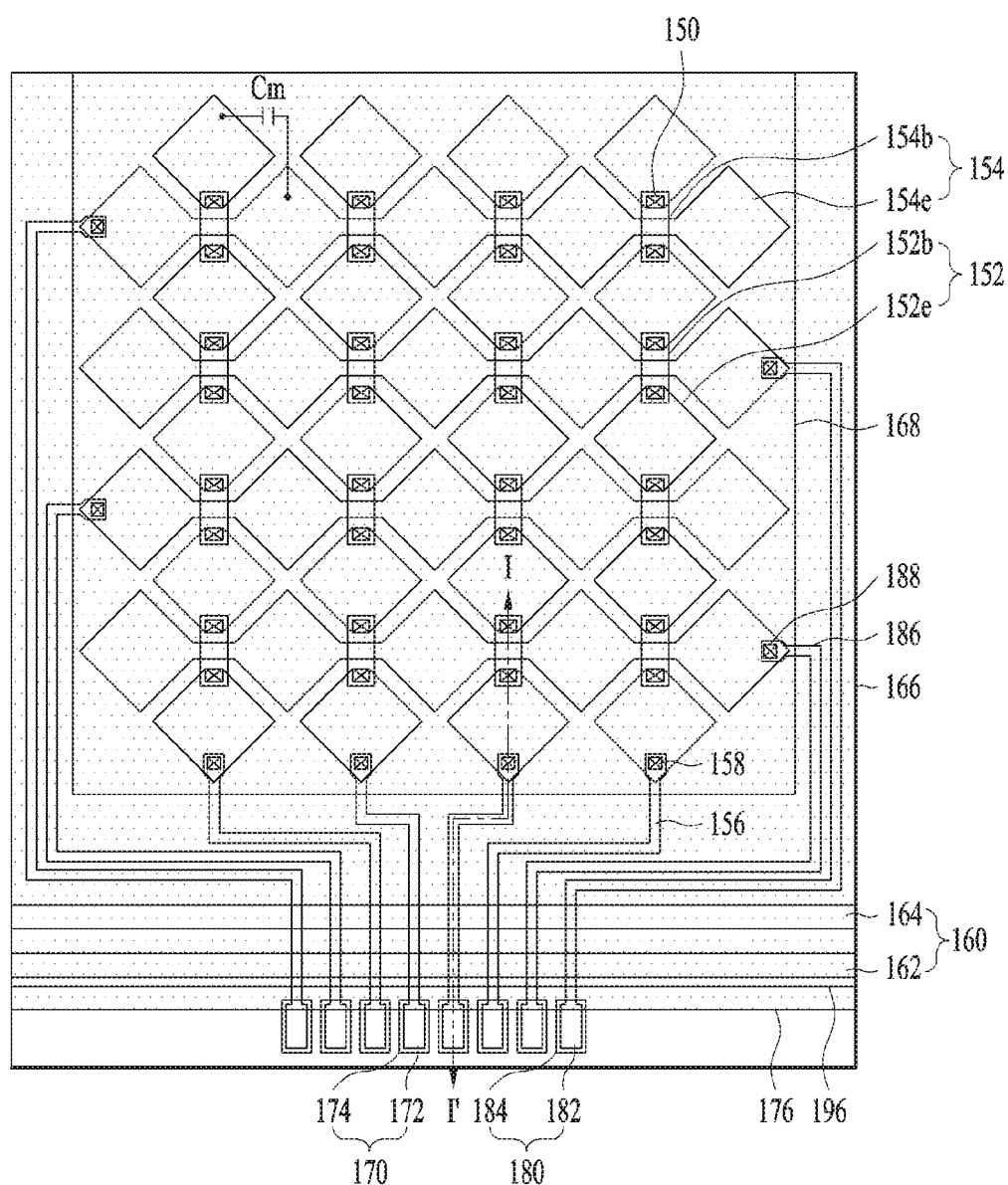
FIG. 3 is a plan view illustrating elements disposed in the active area and a pad area shown in FIG. 1 in accordance with one embodiment.

The active area AA senses whether or not user touch occurs and a touch position by sensing change in mutual capacitance Cm due to the user touch during a touch period through touch electrodes 152e and 154e shown in FIG. 3. Further, the active area AA displays an image through unit pixels including light emitting elements. The unit pixel includes red (R), green (G) and blue (B) sub-pixels PXL, or includes red (R), green (G), blue (B), and white (W) sub-pixels PXL.

Therefore, the active area AA includes, as exemplarily shown in FIG. 2, a plurality of sub-pixels PXL arranged in a matrix on a substrate 111, an encapsulation unit 140 disposed on the sub-pixels PXL, a touch buffer film 166 disposed on the encapsulation unit 140, and mutual capacitances Cm disposed on the touch buffer film 166.

Each of the sub-pixels PXL includes a pixel driving circuit and a light emitting element 120 connected to the pixel driving circuit.

The pixel driving circuit includes a switching thin film transistor T1, a driving thin film transistor T2 and a storage capacitor Cst.

When a scan pulse is supplied to a scan line SL, the switching thin film transistor T1 is turned on and thus supplies a data signal supplied to a data line DL to the storage capacitor Cst and a gate electrode of the driving thin film transistor T2.

The driving thin film transistor T2 controls current I supplied from a high voltage power VDD line to the light emitting element 120 in response to the data signal supplied to the gate electrode of the driving thin film transistor T2, thus adjusting the amount of light emitted from the light emitting element 120. Further, even if the switching thin film transistor T1 is turned off, the driving thin film transistor T2 supplies regular current I by voltage charging the storage capacitor Cst until a data signal of a next frame is supplied and, thus, the light emitting element 120 maintains light emission.

Figure 4:
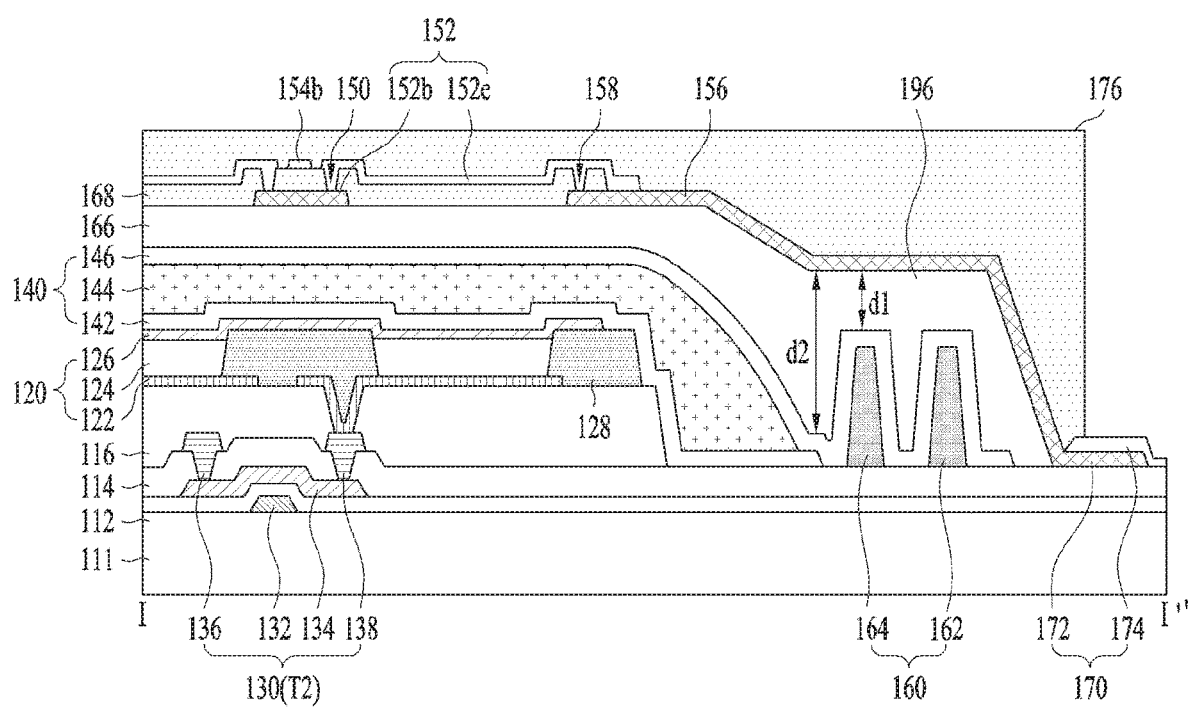
FIG. 4 is a cross-sectional view of the organic light emitting display, taken along line I-I' of FIG. 3 in accordance with one embodiment.

Such a driving thin film transistor 130 (T2) includes, as exemplarily shown in FIG. 4, a gate electrode 132, a semiconductor layer 134 overlapping the gate electrode 132 with a gate insulating film 112 interposed there between, and source and drain electrodes 136 and 138 formed on a protective film 114 and contacting the semiconductor layer 134.

The light emitting element 120 includes an anode 122, an organic light emitting layer 124 formed on the anode 122, and a cathode 126 formed on the organic light emitting layer 124.

The anode 122 is conductively connected to the drain electrode 138 of the driving thin film transistor 130 (T2) exposed through a pixel contact hole formed through a planarization film 116. The organic light emitting layer 124 is formed on the anode 122 in an emission region provided by a bank 128. The organic light emitting layer 124 is formed by stacking a hole-related layer, a light emitting layer and an electron-related layer on the anode 122 in regular order or in reverse order. The cathode 126 is formed to be opposite the anode 122 with the organic light emitting layer 124 interposed there between.

The encapsulation unit 140 prevents external moisture or oxygen from penetrating through the light emitting element 120, which is vulnerable to external moisture or oxygen. For this purpose, the encapsulation unit 140 includes a plurality of inorganic encapsulation layers 142 and 146 and an organic encapsulation layer 144 disposed between the inorganic encapsulation layers 142 and 146, and the inorganic encapsulation layer 146 is disposed as the uppermost layer. Here, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be exemplarily described.

The first inorganic encapsulation layer 142 is formed on the substrate 111 provided with the cathode 126 to be located most adjacent to the light emitting element 120. Such a first inorganic encapsulation layer 142 is formed of an inorganic insulating material which may be deposited at a low temperature, such as silicon nitride (SiNx), silicon oxide (SiOx), silicon oxynitride (SiON) or aluminum oxide ($Al_2O_3$). Since the first inorganic encapsulation layer 142 is deposited at a low temperature, damage to the organic light emitting layer 124, which is vulnerable to a high-temperature atmosphere, during a deposition process of the first inorganic encapsulation layer 142 may be prevented.

The organic encapsulation layer 144 is formed to have a smaller area than that of the first inorganic encapsulation layer 142 to expose both ends of the first inorganic encapsulation layer 142. The organic encapsulation layer 144 serves as a buffer to damp stress between respective layers according to bending of the organic light emitting display and strengthens planarization performance of the organic light emitting display. The organic encapsulation layer 144 is formed of an organic insulating material, such as acrylic resin, epoxy resin, polyimide, polyethylene or silicon oxycarbide (SiOC).

If the organic encapsulation layer 144 is formed through an inkjet method, a plurality of dams 160 disposed in parallel between the pad area PA and the active area AA is formed. For example, the dams 160 includes a first dam 162 adjacent to the pad area PA, in which touch sensing pads 180 and touch driving pads 170 are formed, and a second dam 164 adjacent to the active area AA. The dams 160 serve to prevent the organic encapsulation layer 144 in a liquid state from invading the pad area PA, when the organic encapsulation layer 144 in the liquid state is disposed in the active area AA. Each of the first and second dams 162 and 164 is formed to have a monolayer or multilayer structure. For example, each of the first and second dams 162 and 164 is formed of the same material as at least one of the banks 128 and spacers (not shown) simultaneously therewith and, thus, no additional mask process may be required and cost increase may be prevented.

The second inorganic encapsulation layer 146 is formed on the substrate 111 provided with the organic encapsulation layer 144 formed thereon to cover the upper and side surfaces of the organic encapsulation layer 144 and the first organic encapsulation layer 142. Therefore, the second inorganic encapsulation layer 146 minimizes or blocks penetration of external moisture or oxygen into the first inorganic encapsulation layer 142 and the organic encapsulation layer 144. Such a second inorganic encapsulation layer 146 is formed of an inorganic insulating material, such as silicon nitride (SiNx), silicon oxide (SiOx), silicon oxynitride (SiON) or aluminum oxide (Al2O3).

The touch buffer film 166 is disposed on the encapsulation unit 140. The touch buffer film 166 is formed between each of touch sensing lines 154 and touch driving lines 152 and the light emitting element 120 and thus maintains a separation distance of at least 5 μm between each of the touch sensing lines 154 and the touch driving lines 152 and the cathode 126. Therefore, capacitance of a parasitic capacitor between each of the touch sensing lines 154 and the touch driving lines 152 and the cathode 126 may be minimized and, thus, mutual influences between each of the touch sensing lines 154 and the touch driving lines 152 and the cathode 126 due to coupling there between may be prevented. If the separation distance between each of the touch sensing lines 154 and the touch driving lines 152 and the cathode 126 is less than 5 μm, touch performance is lowered by mutual influences between each of the touch sensing lines 154 and the touch driving lines 152 and the cathode 126 due to coupling there between.

Further, the touch buffer film 166 may prevent a liquid chemical (a developing solution or an etching solution), used during a process of manufacturing the touch sensing lines 154 and the touch driving lines 152 disposed on the touch buffer film 166, or moisture from the outside from invading the organic light emitting layer 124. Therefore, the touch buffer film 166 may prevent damage to the organic light emitting layer 124, which is vulnerable to the liquid chemical or moisture.

The touch buffer film 166 may be formed of an organic insulating material, which is formable at a low temperature of 100° C. or lower and has a low dielectric constant of 1 to 3, to prevent damage to the organic light emitting layer 124, which is vulnerable to high temperature. For example, the touch buffer film 166 may be formed of an acryl-based, epoxy-based or siloxane-based material. The touch buffer film 166 formed of an organic insulating material and having planarization performance may prevent breakage of the touch sensing lines 154 and the touch driving lines 152 formed on the touch buffer film 166 and damage to the respective encapsulation layers 142, 144 and 146 of the encapsulation unit 140 due to warpage of the organic light emitting display.

The touch sensing lines 154 and the touch driving lines 152 are disposed on the touch buffer film 166 to intersect each other with a touch insulating film 168 interposed there between.

The touch driving line 152 includes a plurality of first touch electrodes 152e, and first bridges 152b to conductively connect the first touch electrodes 152e.

The first touch electrodes 152e are spaced apart from each other in the Y-axis direction on the touch insulating film 168. Each of the first touch electrodes 152e is conductively connected to the adjacent first touch electrode 152e through the first bridge 152b.

The first bridges 152b are formed on the touch buffer film 166, exposed through touch contact holes 150 formed through the touch insulating film 168, and conductively connected to the first touch electrodes 152e. The first bridge 152b is disposed to overlap the bank 128 and, thus, lowering of an aperture ratio due to the first bridges 152b may be prevented.

The touch sensing line 154 includes a plurality of second touch electrodes 154e, and second bridges 154b to conductively connect the second touch electrodes 154e.

The second touch electrodes 154e are spaced apart from each other in the X-axis direction on the touch insulating film 168. Each of the second touch electrodes 154e is conductively connected to the adjacent second touch electrode 154e through the second bridge 154b.

The second bridges 154b are disposed on the touch insulating film 168 which is coplanar with the second touch electrodes 154e and thus are conductively connected to the second touch electrodes 154e without separate contact holes. In the same manner as the first bridge 152b, the second bridge 154b is disposed to overlap the bank 128 and, thus, lowering of an aperture ratio due to the second bridges 154b may be prevented.

Since the touch sensing lines 154 and the touch driving lines 152 intersect each other with the touch insulating film 168 interposed there between, mutual capacitances Cm are formed at the intersections between the touch sensing lines 154 and the touch driving lines 152. Therefore, the mutual capacitance Cm is charged with charges by a touch driving pulse supplied from the touch driving line 152 and discharges the charges to the touch sensing line 154, thus serving as a touch sensor.

The touch driving lines 152 of the present disclosure are connected to a touch driving unit (not shown) through first routing lines 156 and the touch driving pads 170. Further, the touch sensing lines 154 are connected to the touch driving unit through second routing lines 186 and the touch sensing pads 180.

Each of the touch driving pads 170 and the touch sensing pads 180 respectively includes a pad electrode 172 or 182 and a pad cover electrode 174 or 184 disposed on the pad electrode 172 or 182 to cover the pad electrode 172 or 182.

The pad electrodes 172 and 182 extend from the first and second routing lines 156 and 186. Therefore, the pad electrodes 172 and 182 of the touch driving pads 170 and the touch sensing pads 180 are formed of a first conductive layer which is the same material as the first and second routing lines 156 and 186. Here, the first conductive layer is formed to have a monolayer structure or a multilayer structure using metals having high corrosion resistance and high acid resistance, such as aluminum (Al), titanium (Ti), copper (Cu) and molybdenum (Mo). For example, the first conductive layer has a tri-layer structure, such as Ti/Al/Ti or Mo/Al/Mo.

The pad cover electrodes 174 and 184 are formed of a second conductive layer which is the same material as the first and second touch electrodes 152e and 154e. Here, the second conductive layer is a transparent conductive layer having high corrosion resistance and high acid resistance, such as ITO or IZO. The pad cover electrodes 174 and 184 are exposed by a touch protective film 176, thus being connected to a signal transmission film on which the touch driving unit is mounted. Here, the touch protective film 176 is formed to cover the touch sensing lines 154 and the touch driving lines 152, thus preventing the touch sensing lines 154 and the touch driving lines 152 from being corroded by external moisture, etc. The touch protective film 176 is a film formed of an organic insulating material, a circularly polarizing plate, or a film formed of epoxy or acryl.

The first routing line 156 is conductively connected to the first touch electrode 152e through a first routing contact hole 158 and, thus, transmits a touch driving pulse from the touch driving pad 170 to the touch driving line 152. The second routing line 186 is conductively connected to the second touch electrode 154e through a second routing contact hole 188 and, thus, transmits a touch signal from the touch sensing line 154 to the touch sensing pad 180. Here, the first routing line 156 extends from the first touch electrode 152e in at least one of the upward direction and the downward direction of the active area and is connected to the touch driving pad 170, and the second routing line 186 extends from the second touch electrode 154e in at least one of the leftward direction and the rightward direction of the active area and is connected to the touch sensing pad 180. Such dispositions of the first and second routing lines 156 and 186 may be variously modified according to design specifications of the display.

The first and second routing lines 156 and 186 are formed on a compensation film 196 to cut across the dams 160. The first and second routing lines 156 and 186 cover the side surface of the compensation film 196. The side surface might be inclined. The compensation film 196 is formed integrally with the touch buffer film 166 and is formed of the same material as the touch buffer film 166. For example, the compensation film 196 is formed of an acryl-based, epoxy-based or siloxane-based organic insulating material having high planarization performance.

The compensation film 196 formed of an organic insulating material having high planarization performance is formed to have different thicknesses between a region above the dams 160 and a boundary region between the dams 160 and the organic encapsulation layer 144. That is, the thickness d1 of the compensation film 196 in the region above the dams 160 is less than the thickness d2 of the compensation film 196 in the boundary region between the dams 160 and the organic encapsulation layer 144 and, thus, the compensation film 196 has a planarized surface in the region above the dams 160 and in the boundary region between the dams 160 and the organic encapsulation layer 144. In this case, the routing line disposed on the compensation film 196 in the region above the dams 160 is disposed at a higher position than that of the upper surface of the planarization film 116 disposed to cover the driving thin film transistor 130 (T2) and, thus, the routing line is disposed in the boundary region and the region above the dams 160 in parallel or on the same level as in the boundary region. Therefore, the routing line disposed above the planarization film 116 and the routing line disposed above the dams 160 are substantially formed in parallel with each other and, thus, cut or short-circuit of each of the first and second routing lines 156 and 186 cutting across the dams 160 may be prevented. Therefore, comparative examples in which no compensation film 196 is provided and a test example in which a compensation film 196 is provided will be comparatively described with reference to FIGS. 5A to 5C.

Figure 5A:
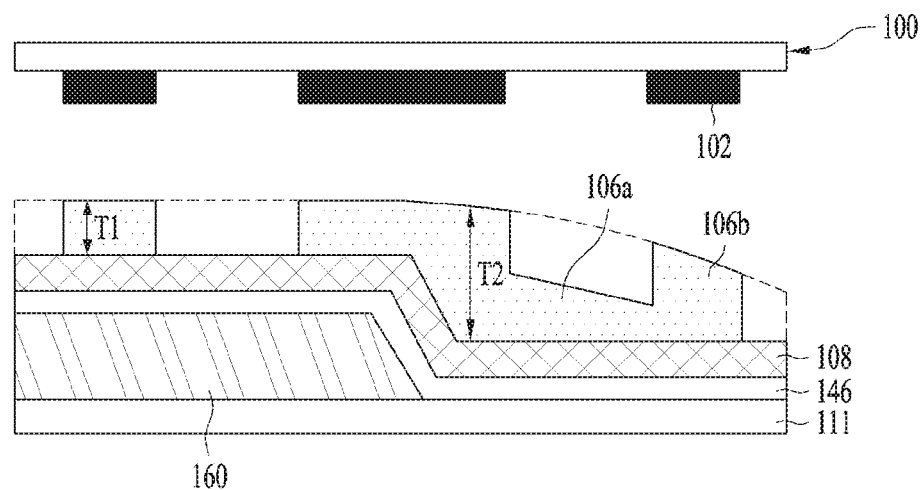
FIGS. 5A to 5C are views comparatively illustrating comparative examples without a compensation film and a test example with a compensation film in accordance with one embodiment.
Figure 5A:
Figure 5A:
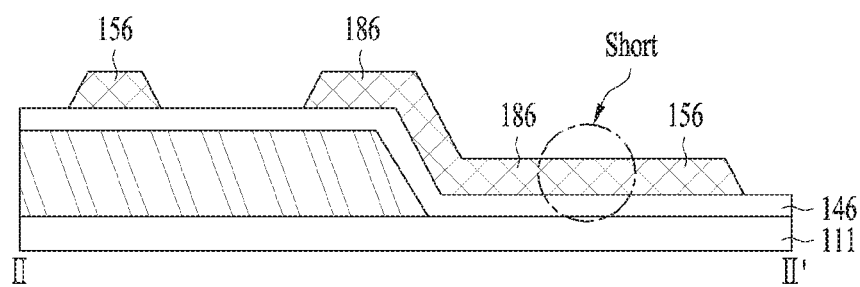
Figure 5A:
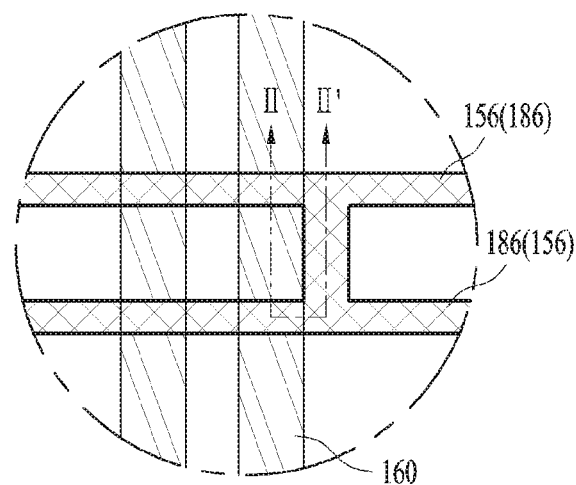
Figure 5B:
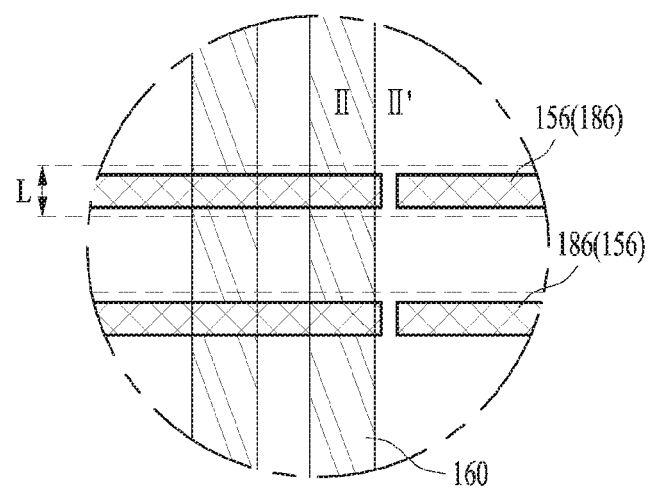

That is, in case of the comparative examples in which there is no compensation film 196 covering dams 160, as exemplarily shown in FIGS. 5A and 5B, short-circuit between the adjacent routing lines 156 and 186 occurs or the routing lines 156 and 186 are cut. In more detail, after a first conductive layer 108 is deposited on the entire surface of a substrate 111, on which a second inorganic encapsulation layer 146 is formed to cover the dams 160, a photoresist in a liquid state is coated on the first conductive layer 108. Here, a thickness T2 of the photoresist formed in a region between the side surface of the dam 160 and the substrate 111 is greater than a thickness T1 of the photoresist formed in a region above the dam 160. The photoresist is exposed to light through a photo mask 100 provided with a light shielding layer 102.

Here, if a light exposure dose is determined based on the thickness T1 of the photoresist formed in the region above the dam 160, the photoresist having the thickness T2 greater than the thickness T1 and formed in the region between the side surface of the dam 160 and the substrate 111, is not effectively exposed to light and, thus, after a developing process, a residual layer 106a remains. If the first conductive layer 108 is etched using a photoresist pattern 106b having such a residual layer 106a, the first conductive layer 108 remains in a region corresponding to the residual layer 106a and thus the adjacent routing lines 156 and 186 are short-circuited.

Further, if the light exposure dose is determined based on the thickness T2 of the photoresist formed in the region between the side surface of the dam 160 and the substrate 111, the photoresist having the thin thickness T1 is excessively exposed to light and, thus, after the developing process, a photoresist pattern 106b having a line width less than a desired design value is formed. If the first conductive layer 108 is etched using such a photoresist pattern 106b as a mask, the line width of the routing lines 156 and 186 is smaller than a line width L corresponding to a design value or the routing lines 156 and 186 are cut, as exemplarily shown in FIG. 5B.

Figure 5C:
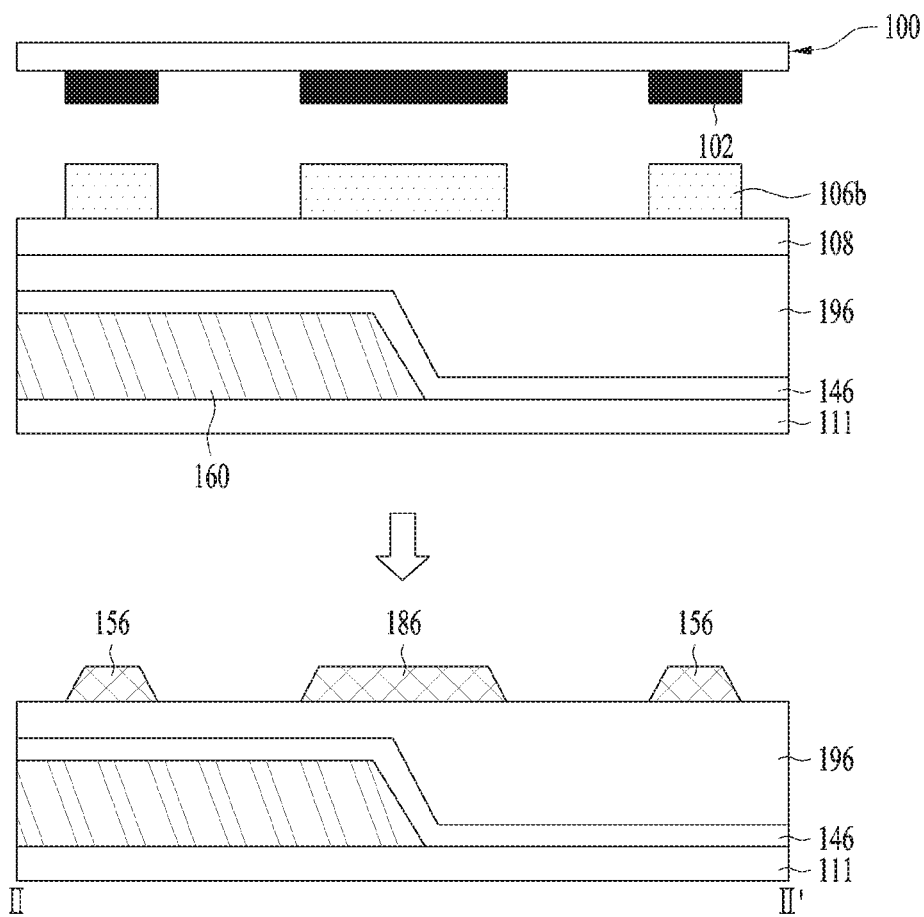
Figure 5C:
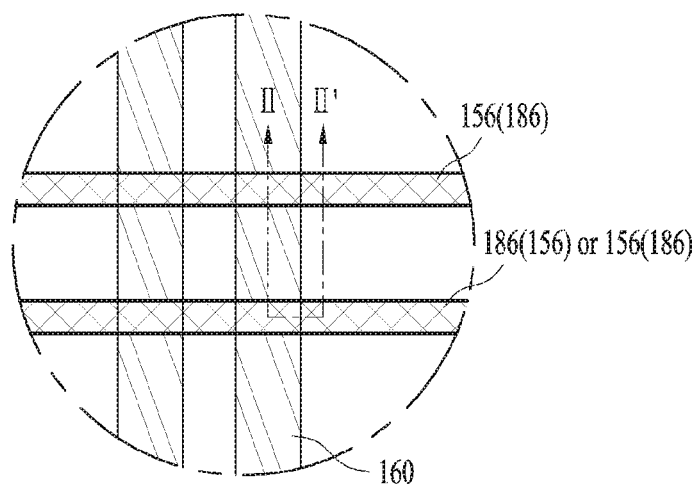

On the other hand, in the test example in which there is a compensation film 196 covering dams 160, as exemplarily shown in FIG. 5C, short-circuit between the adjacent routing lines 156 and 186 or cut of each of the routing lines 156 and 186 may be prevented. In more detail, after a first conductive layer 108 is deposited on the entire surface of a substrate 111, on which a second inorganic encapsulation layer 146 and a compensation film 196 are formed to cover the dams 160, a photoresist 106 in a liquid state is coated on the first conductive layer 108. Here, the photoresist 106 formed on the first conductive layer 108 has a uniform thickness regardless of positions due to the compensation film 196. By executing light exposure and development of the photoresist 106 using a photo mask 100 provided with a light shielding layer 102, a photoresist pattern 106b having the same thickness throughout all regions of the substrate 111 is formed. When the first conductive layer 108 is patterned through an etching process using the photoresist pattern 106b as a mask, routing lines 156 and 186 having a line width corresponding to a desired design value are formed.

As described above, in the organic light emitting display having a touch sensor in accordance with this embodiment of the present disclosure, the compensation film 196 having a flat surface is formed to cover the dams 160 and thus minimizes a part generated by the dams 160, thereby being capable of preventing short-circuit or cut of the routing lines 156 and 186. Further, while, in a conventional organic light emitting display, a touchscreen is attached to a display panel through an adhesive, in the organic light emitting display in accordance with the present disclosure, the touch electrodes 152e and 154e are disposed on the encapsulation unit 140, a separate attachment process is omitted and, thus, process simplification and cost reduction may be achieved.

FIGS. 6A to 6E are plan and cross-sectional views illustrating a method of fabricating the organic light emitting display shown in FIGS. 3 and 4 in accordance with one embodiment.

Figure 6A:
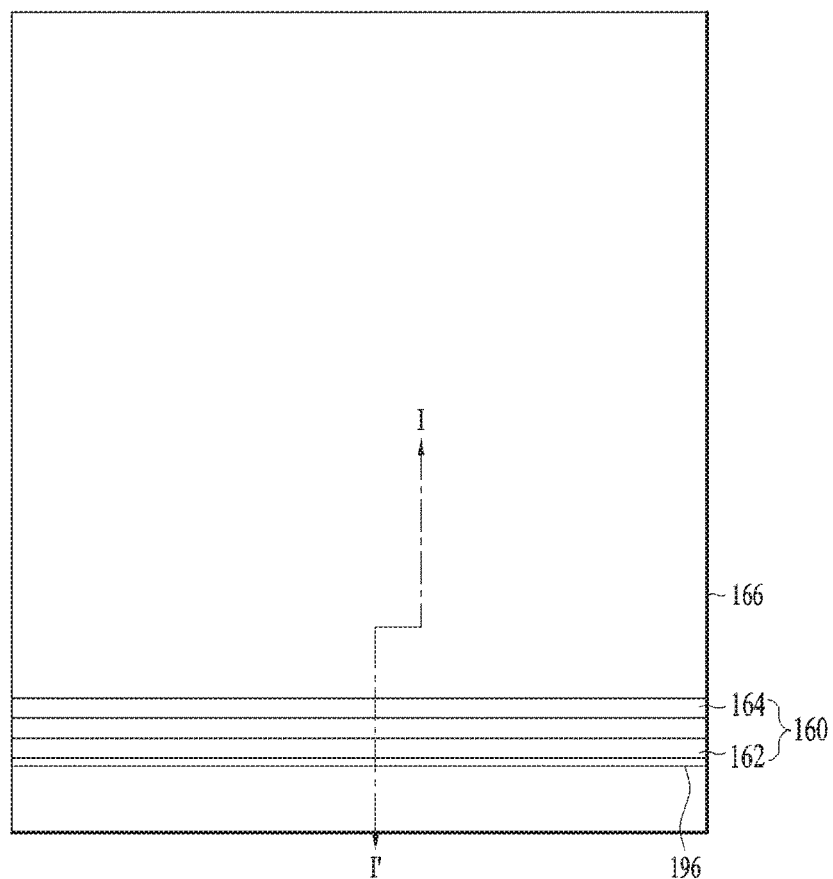
FIGS. 6A to 6E are plan and cross-sectional views illustrating a method of fabricating the organic light emitting display shown in FIGS. 3 and 4 in accordance with one embodiment.
Figure 6A:
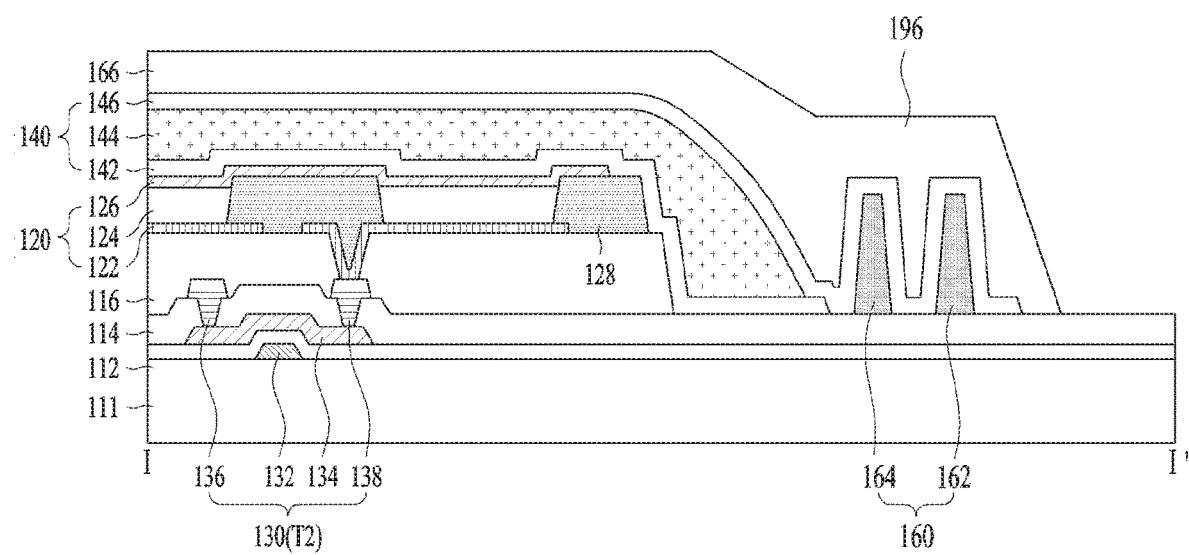

With reference to FIG. 6A, the touch buffer film 166 and the compensation film 196 are formed on the substrate 111 provided with the switching thin film transistors, the driving thin film transistors 130, the anodes 122, the organic light emitting layer 124, the cathodes 126, the dams 160 and the encapsulation unit 140 formed thereon.

In more detail, the touch buffer layer 166 and the compensation film 196 are simultaneously formed by applying an organic insulating material to the substrate 111 provided with the switching thin film transistors, the driving thin film transistors 130, the anodes 122, the organic light emitting layer 124, the cathodes 126, the dams 160 and the encapsulation unit 140 formed thereon, and then patterning the organic insulating material through a photolithography process and an etching process using a first mask.

Figure 6B:
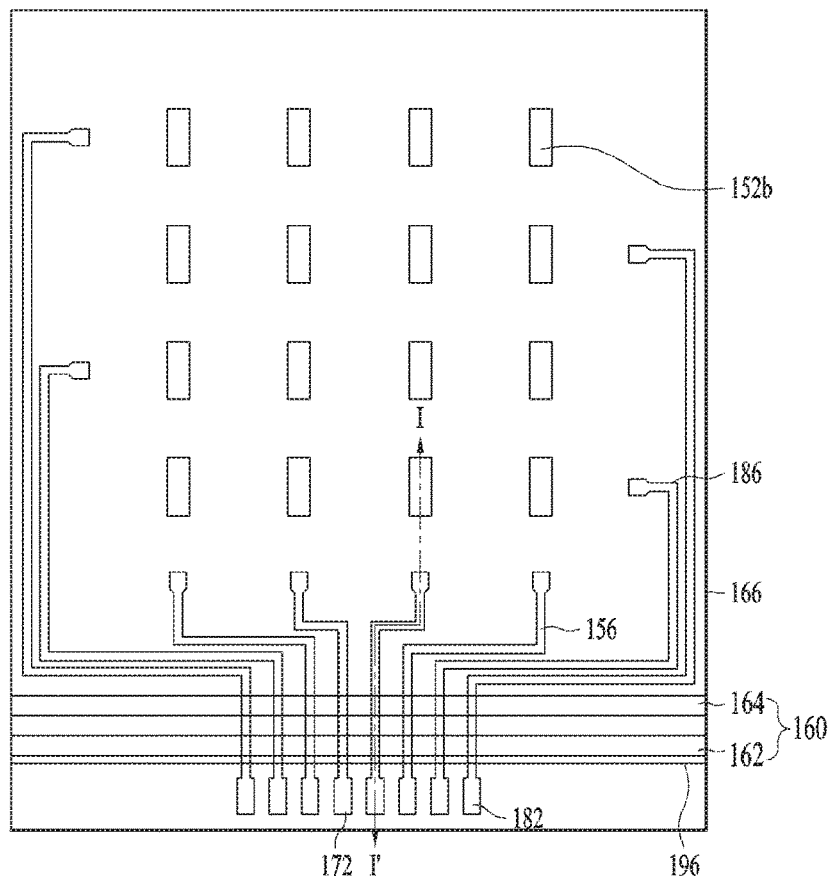
Figure 6B:
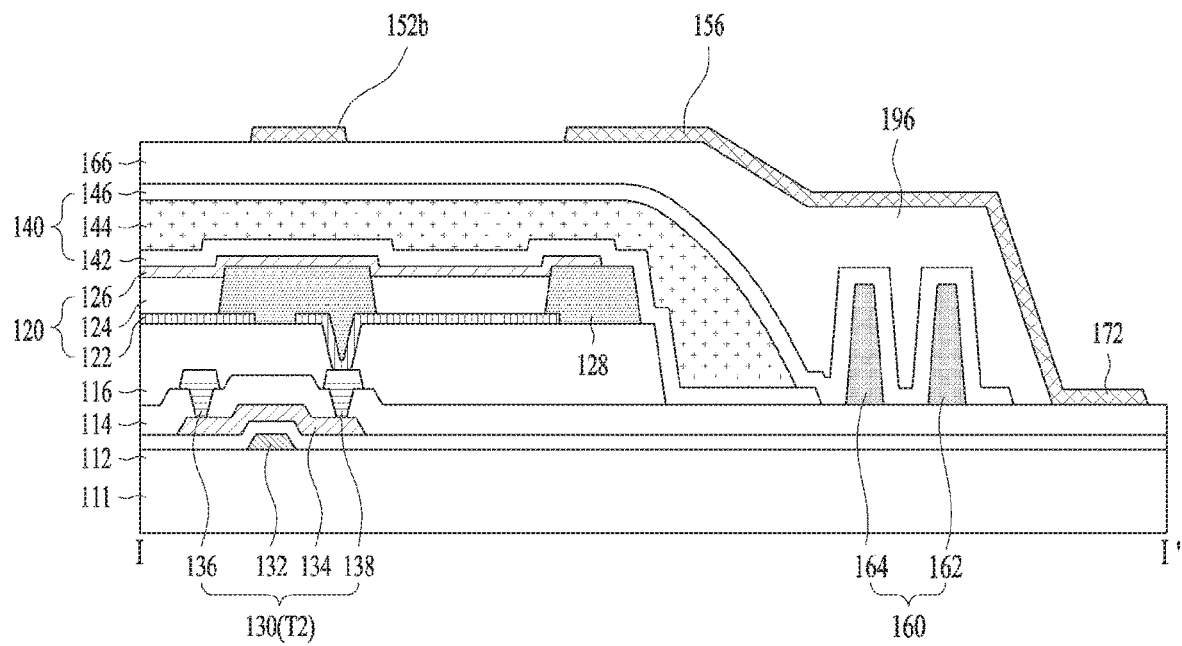

Thereafter, with reference to FIG. 6B, the first bridges 152b, the pad electrodes 172 and 182 and the first and second routing lines 156 and 186 are formed on the substrate 111 provided with the touch buffer film 166 and the compensation film 196 formed thereon.

In more detail, a first conductive layer is deposited on the substrate 111 provided with the touch buffer film 166 and the compensation film 196 formed thereon and is then patterned through a photolithography process and an etching process using a second mask. Thereby, the first bridges 152b, the pad electrodes 172 and 182 and the first and second routing lines 156 and 186 are formed on the substrate 111 provided with the touch buffer film 166 and the compensation film 196 formed thereon.

Figure 6C:
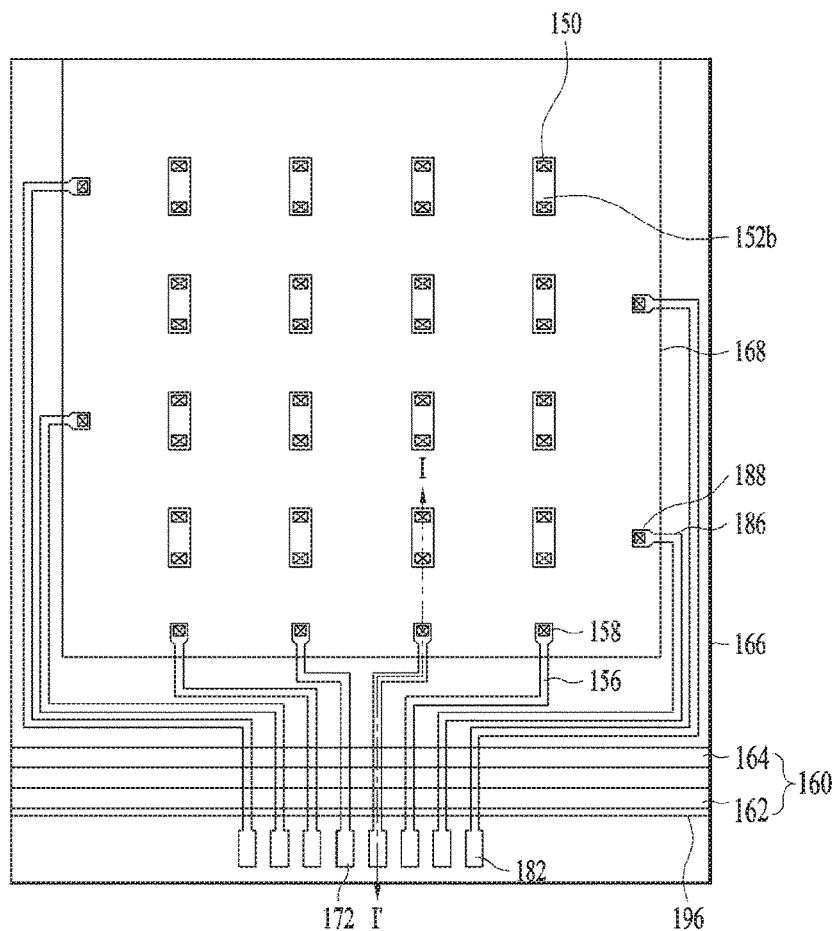
Figure 6C:
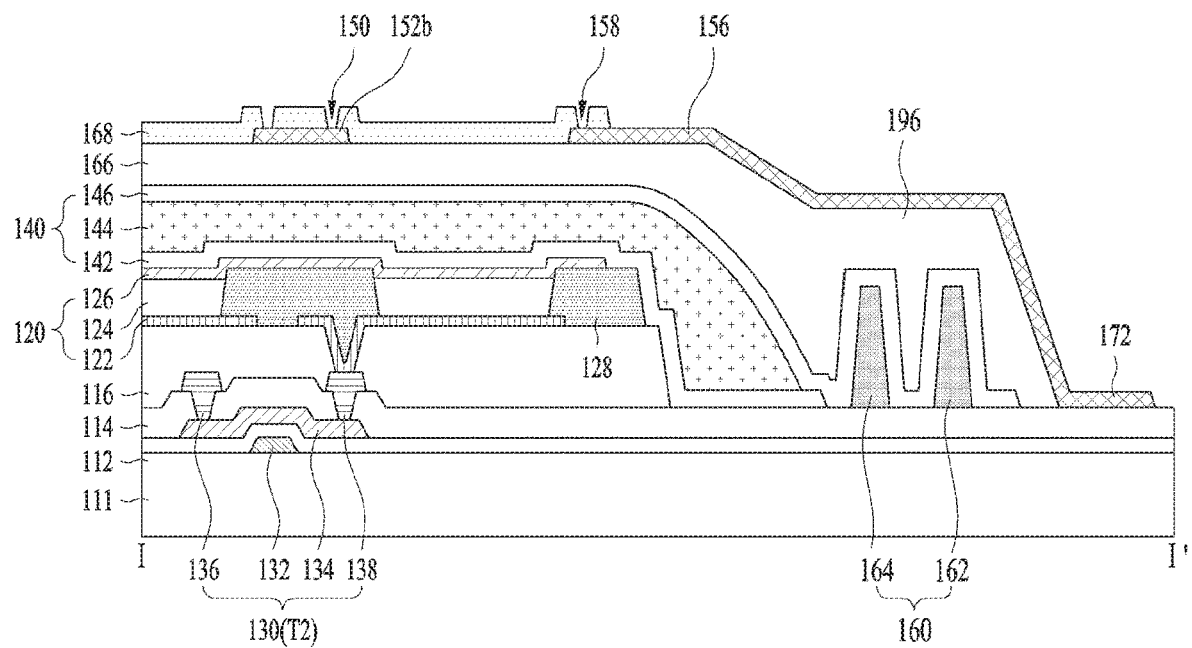

With reference to FIG. 6C, the touch insulating film 168 provided with the touch contact holes 150 and the routing contact holes 158 is formed on the substrate 111 provided with the first bridge 152b, the pad electrodes 172 and 182 and the first and second routing lines 156 and 186.

In more detail, the touch insulating film 168 is formed by applying an inorganic insulating material or an organic insulating material to the entire surface of the substrate 111 provided with the first bridges 152b, the pad electrodes 172 and 182 and the first and second routing lines 156 and 186. Here, the touch insulating film 168 uses an inorganic insulating material, such as SiNx, SiON or SiO2, or a photoacryl-based, parylene-based or siloxane-based organic insulating material. Thereafter, the touch insulating film 168 is patterned through a photolithography process and an etching process using a third mask, thus forming the touch contact holes 150 and the routing contact holes 158.

Figure 6D:
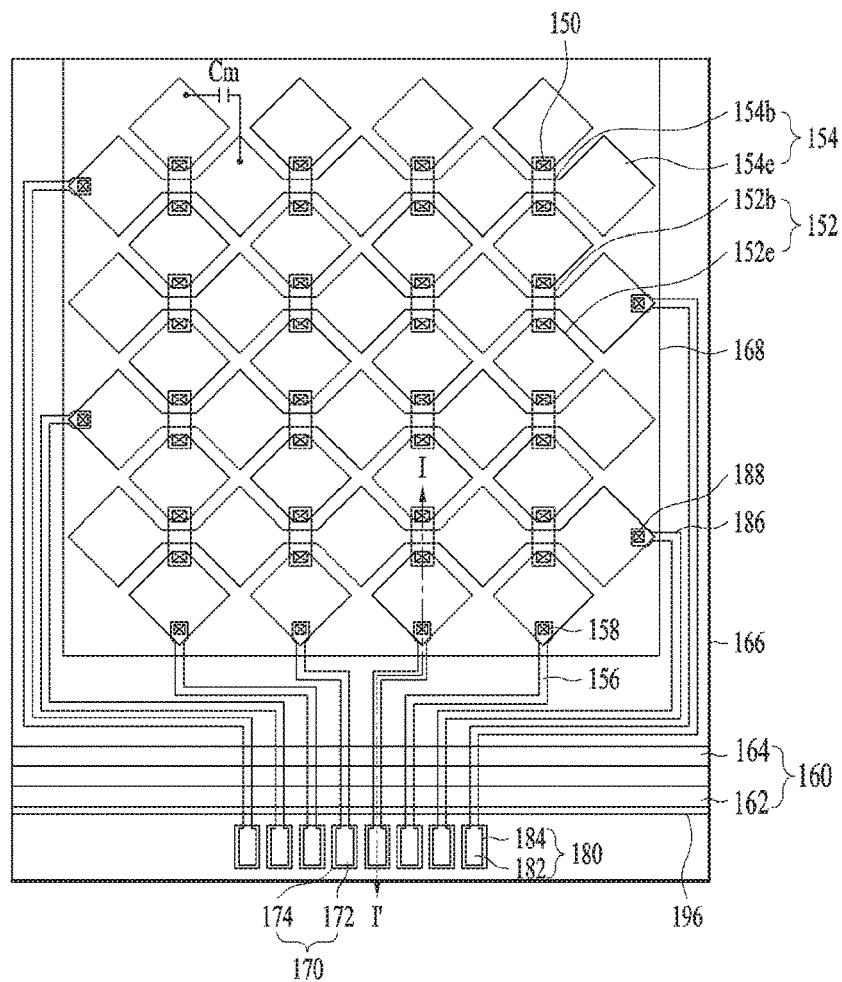
Figure 6D:
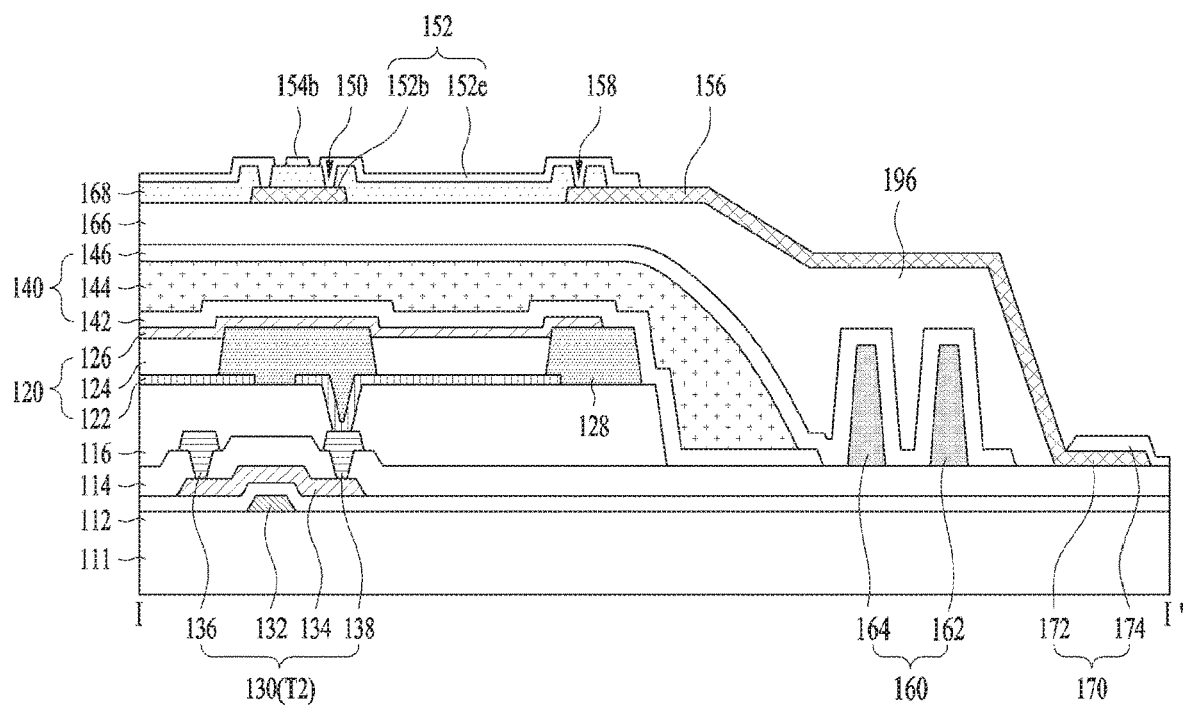

With reference to FIG. 6D, the pad cover electrodes 174 and 184, the first and second touch electrodes 152e and 154e and the second bridges 154b are formed on the substrate 111 provided with the touch insulating film 168 having the touch contact holes 150 and the routing contact holes 158.

In more detail, a second conductive layer is deposited on the substrate 111 provided with the touch insulating film 168 having the touch contact holes 150 and the routing contact holes 158 and is then patterned through a photolithography process and an etching process using a fourth mask, thereby forming the pad cover electrodes 174 and 184, the first and second touch electrodes 152e and 154e and the second bridges 154b.

Figure 6E:
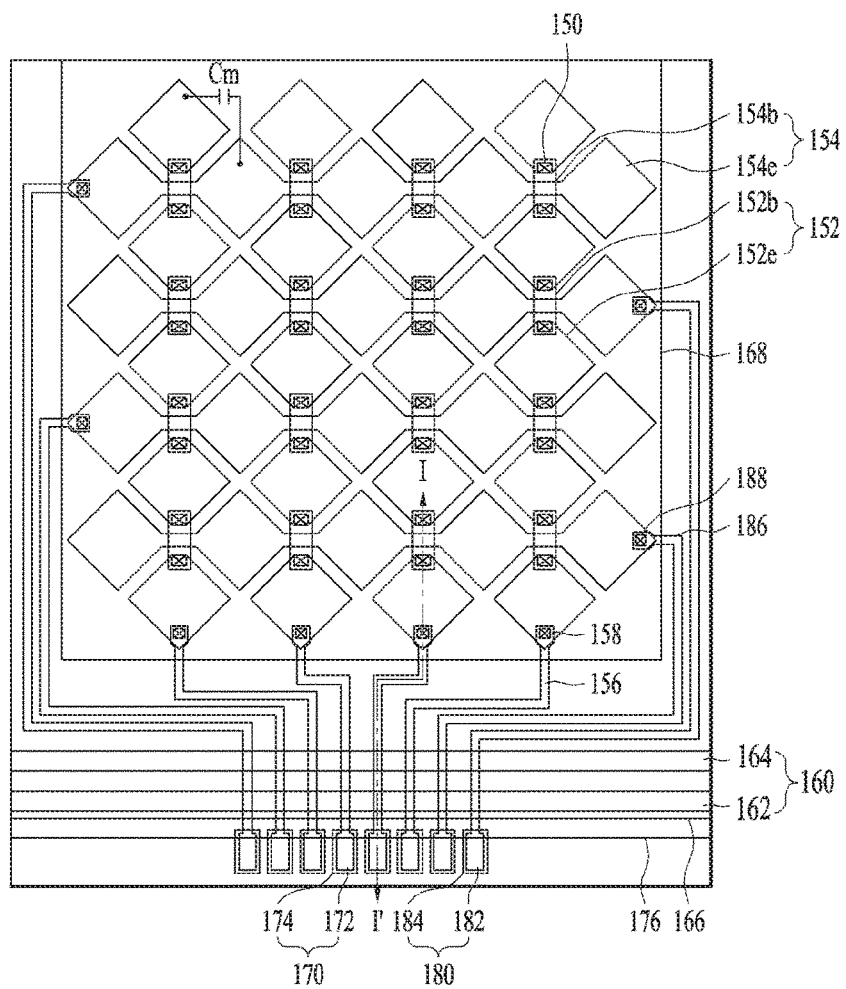
Figure 6E:
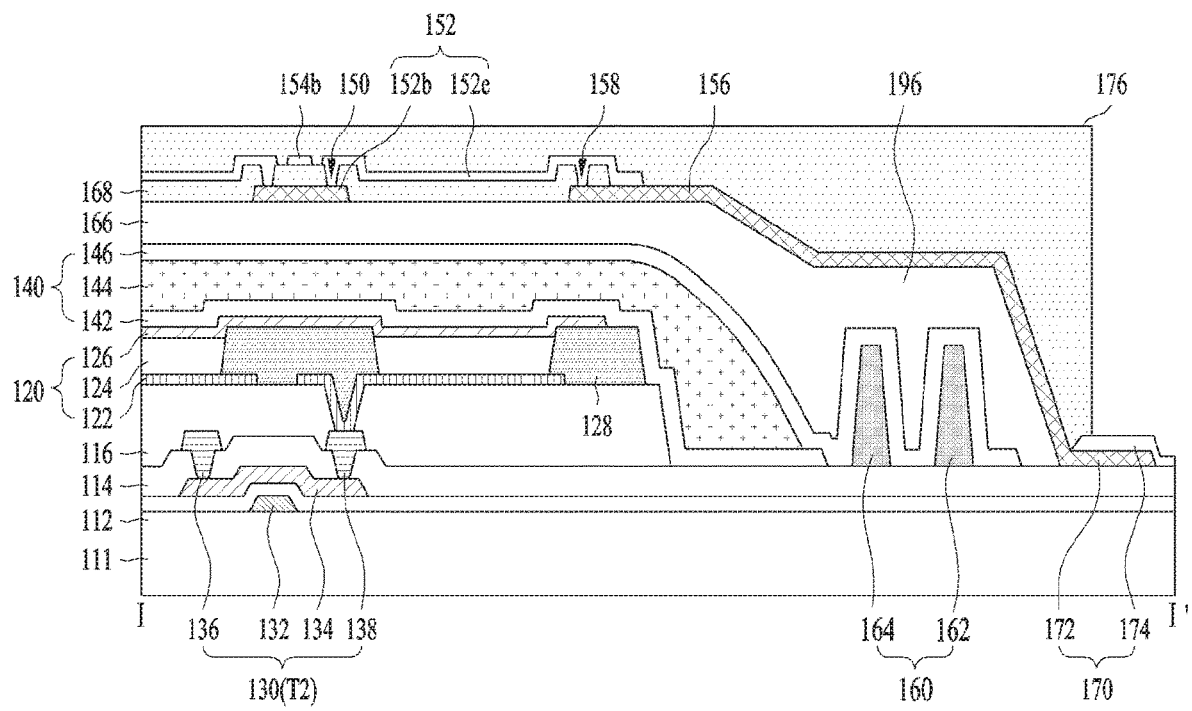

With reference to FIG. 6E, the touch protective film 176 is formed on the substrate 111 provided with the pad cover electrodes 174 and 184, the first and second touch electrodes 152e and 154e and the second bridges 154b.

In more detail, an organic insulating material is applied to the entire surface of the substrate 111 provided with the pad cover electrodes 174 and 184, the first and second touch electrodes 152e and 154e and the second bridges 154b. Thereafter, the organic insulating material is patterned through a photolithography process and an etching process using a fifth mask, thereby forming the touch protective film 176 exposing the touch driving pads 170 and the touch sensing pads 180.

Figure 7:
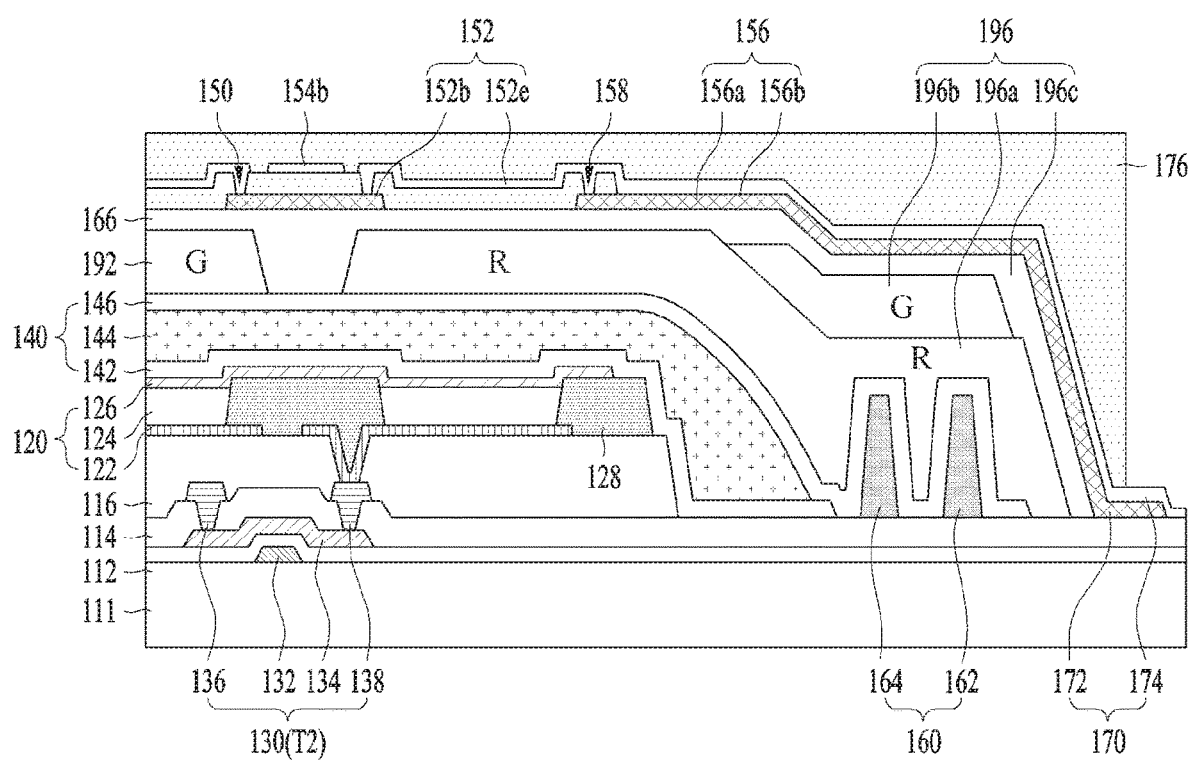
FIG. 7 is a cross-sectional view illustrating an organic light emitting display in accordance with a further embodiment of the present disclosure.

FIG. 7 is a cross-sectional view illustrating an organic light emitting display in accordance with a further embodiment of the present disclosure.

The organic light emitting display shown in FIG. 7 is the same as the organic light emitting display shown in FIGS. 3 and 4, except that a compensation film 196 is formed to have a multilayer structure formed of the same materials as color filters 192. Therefore, a detailed description of elements of the organic light emitting display shown in FIG. 7, which are substantially the same as those of the organic light emitting display shown in FIGS. 3 and 4, will be omitted because it is considered to be unnecessary.

The color filters 192 are formed on an encapsulation unit 140 in an active area. Therefore, white light generated by light emitting elements 120 is emitted through the color filters 192, thus forming an image.

Further, the color filters 192 together with the touch buffer film 166 are formed between each of touch sensing lines 154 and touch driving lines 152 and the light emitting element 120. A separation distance between each of the touch sensing lines 154 and the touch driving lines 152 and the light emitting element 120 is increased by the color filters 192 and the touch buffer film 166. Therefore, capacitance of a parasitic capacitor between each of the touch sensing lines 154 and the touch driving lines 152 and the light emitting element 120 may be minimized and, thus, mutual influences between each of the touch sensing lines 154 and the touch driving lines 152 and the light emitting element 120 due to coupling there between may be prevented. Further, the touch buffer film 166 and the color filters 192 may prevent a liquid chemical (a developing solution or an etching solution), used during a process of manufacturing the touch sensing lines 154 and the touch driving lines 152 disposed on the touch buffer film 166, or moisture from the outside from invading an organic light emitting layer 124. Therefore, the touch buffer film 166 and the color filters 192 may prevent damage to the organic light emitting layer 124, which is vulnerable to the liquid chemical or moisture.

The compensation film 196 is formed to have a multilayer structure, and at least one layer of the compensation film 196 is formed of the same material as at least one of red, green and blue color filters 192. For example, the compensation film 196 has a tri-layer structure, and two out of the three layers of the compensation film 196 are formed of the same material as the color filters 192.

A first compensation film layer 196*a* is formed of the same material as any one of the red (R), green (G) and blue (B) color filters 192 to cover the dams 160. Here, a thickness of the first compensation film layer 196*a* in a region above the dams 160 is less than a thickness of the first compensation film layer 196*a* in a boundary region between the dams 160 and the organic encapsulation layer 144 and, thus, the first compensation film layer 196*a* has a planarized surface between the region above the dams 160 and the boundary region between the dams 160 and the organic encapsulation layer 144.

A second compensation film layer 196*b*, which is formed of the same material as the color filter 192 emitting colored light differing from the color filter 192 formed of the same material as the first compensation film layer 196*a*, is formed on the first compensation film layer 196*a*.

A third compensation film layer 196*c*, which is formed of the same material as the touch buffer film 166, is formed on the second compensation film layer 196*b* to be integrated with the touch buffer film 166.

The compensation film 196 compensates for a height difference generated between the region above the dams 160 and the boundary region and may thus prevent cut or short-circuit of the first and second routing lines 156 and 186 cutting across the dams 160.

As described above, in the organic light emitting display having a touch sensor in accordance with this embodiment of the present disclosure, the compensation film 196 having a flat surface is formed to cover the dams 160 and thus minimizes a part generated by the dams 160, thereby being capable of preventing cut or short-circuit of the routing lines 156 and 186. Further, while, in a conventional organic light emitting display, a touchscreen is attached to a display panel through an adhesive, in the organic light emitting display in accordance with the present invention, the touch electrodes 152*e* and 154*e* are disposed on the encapsulation unit 140, a separate attachment process is omitted and, thus, process simplification and cost reduction may be achieved.

Although this embodiment describes the color filters 192 as being disposed on the encapsulation unit 140, the color filters 192 may be disposed on the touch buffer film 166. In this case, the first compensation film layer 196*a* is formed of the same material as the touch buffer film 166 and the second and third compensation film layers 196*b* and 196*c* are formed of the same materials as the color filters 192.

Figure 8:
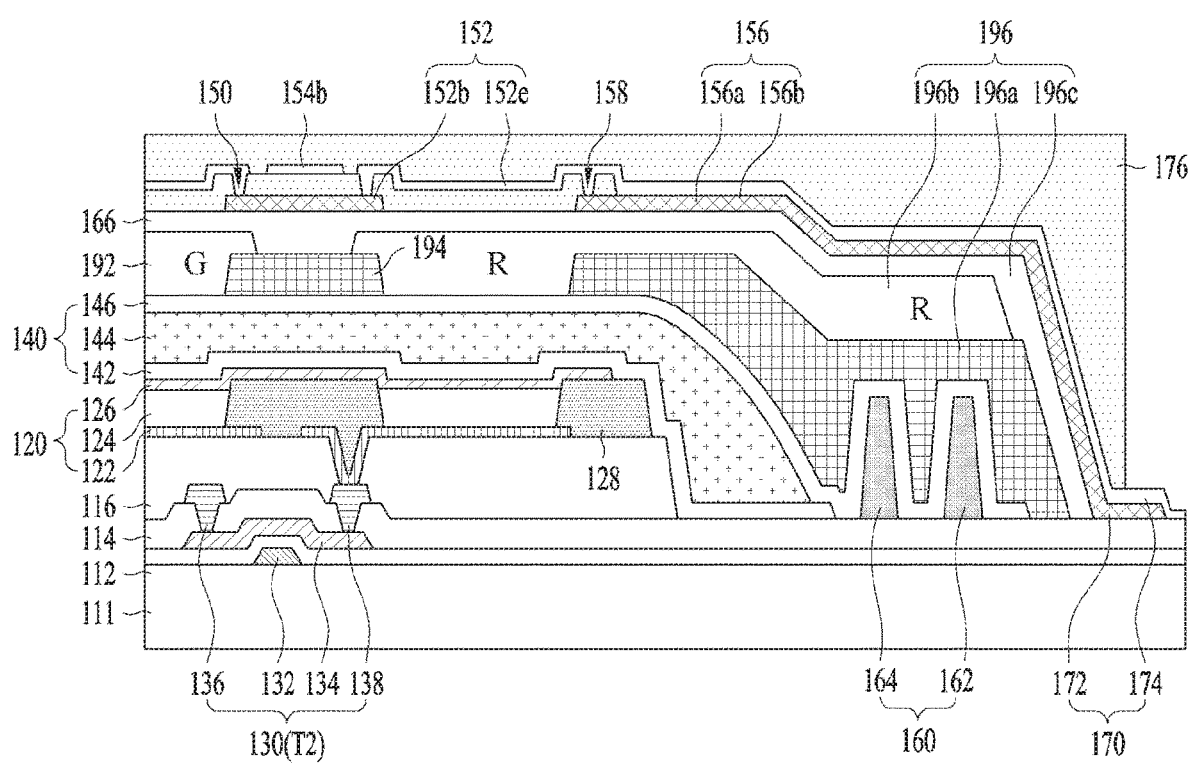
FIG. 8 is a cross-sectional view illustrating an organic light emitting display in accordance with another embodiment of the present disclosure.

FIG. 8 is a cross-sectional view illustrating an organic light emitting display in accordance with another embodiment of the present invention.

The organic light emitting display shown in FIG. 8 is the same as the organic light emitting display shown in FIGS. 3 and 4, except that a compensation film 196 is formed to have a multilayer structure respectively formed of the same materials as color filters 192 and a black matrix 194. Therefore, a detailed description of elements of the organic light emitting display shown in FIG. 8, which are substantially the same as those of the organic light emitting display shown in FIGS. 3 and 4, will be omitted because it is considered to be unnecessary.

The color filters 192 are formed on an encapsulation unit 140 in an active area. Therefore, white light generated by light emitting elements 120 is emitted through the color filters 192, thus forming an image.

The black matrix 194 is formed in a light shielding region between respective sub-pixel regions and serves to discriminate the respective sub-pixel regions and to prevent optical coherence and light leakage between the adjacent sub-pixel regions. The black matrix 194 is formed of a high-resistance black insulating material or is formed by stacking at least two of red (R), green (G) and blue (B) color filters 192.

The compensation film 196 is formed to have a multilayer structure, and at least one layer of the compensation film 196 is formed of the same organic insulating material as at least one of the red, green and blue color filters 192 and at least another layer of the compensation film 196 is formed of the same organic insulating material as the black matrix 194.

For example, the compensation film 196 layer has a structure in which first to third compensation film layers 196*a*, 196*b* and 196*c* are stacked.

The first compensation film layer 196*a* is formed of the same material as the black matrix 194 to cover dams 160. Here, a thickness of the first compensation film layer 196*a* in a region above the dams 160 is less than a thickness of the first compensation film layer 196*a* in a boundary region between the dams 160 and the organic encapsulation layer 144 and, thus, the first compensation film layer 196*a* has a planarized surface between the region above the dams 160 and the boundary region between the dams 160 and the organic encapsulation layer 144.

The second compensation film layer 196*b*, which is formed of the same material as the color filter 192, is formed on the first compensation film layer 196*a*.

The third compensation film layer 196*c*, which is formed of the same material as the touch buffer film 166, is formed on the second compensation film layer 196*b* to be integrated with the touch buffer film 166.

The compensation film 196 compensates for a height difference generated between the region above the dams 160 and the boundary region and may thus prevent cut or short-circuit of the first and second routing lines 156 and 186 cutting across the dams 160.

As described above, in the organic light emitting display having a touch sensor in accordance with this embodiment of the present invention, the compensation film 196 having a flat surface is formed to cover the dams 160 and thus minimizes a part generated by the dams 160, thereby being capable of preventing cut or short-circuit of the routing lines 156 and 186. Further, while, in a conventional organic light emitting display, a touchscreen is attached to a display panel through an adhesive, in the organic light emitting display in accordance with the present invention, the touch electrodes 152*e* and 154*e* are disposed on the encapsulation unit 140, a separate attachment process is omitted and, thus, process simplification and cost reduction may be achieved.

Although these embodiments shown in FIGS. 7 and 8 describe that the height difference generated due to the dams 160 is compensated for by the first or second compensation film layer 196*a* or 196*b* formed of the same material as at least one of the color filters 192 and the black matrix 194 and the third compensation film layer 196*c* formed of the same material as the touch buffer film 166, the generated due to the dams 160 may be compensated for only by the first or second compensation film layer 196*a* or 196*b* formed of the same material as at least one of the color filters 192 and the black matrix 194 without the third compensation film layer 196*c* formed of the same material as the touch buffer film 166.

Further, although FIG. 4 illustrates the first and second routing lines 156 and 186 as being formed to have a monolayer structure, the first and second routing lines 156 and 186 may be formed to have a multilayer structure, as exemplarily shown in FIGS. 7 and 8. In this case, each of the first routing lines 156 may have a structure in which a first routing conductive layer 156*a* and a second routing conductive layer 156*b* are stacked, and each of the second routing lines 186 may have a structure in which a first routing conductive layer (not shown) and a second routing conductive layer (not shown) are stacked. Here, the first routing conductive layer 156a is formed to have a monolayer or multilayer structure using Al, Ti, Cu and Mo, and the second routing conductive layer 156b is formed of ITO or IZO on the first routing conductive layer 156a. Therefore, in case of each of the first and second routing lines 156 and 186, if cut of any one of the first and second routing conductive layers 156a and 156b occurs, the other conductive layer transmits a touch driving pulse and a touch signal.

Figure 9:
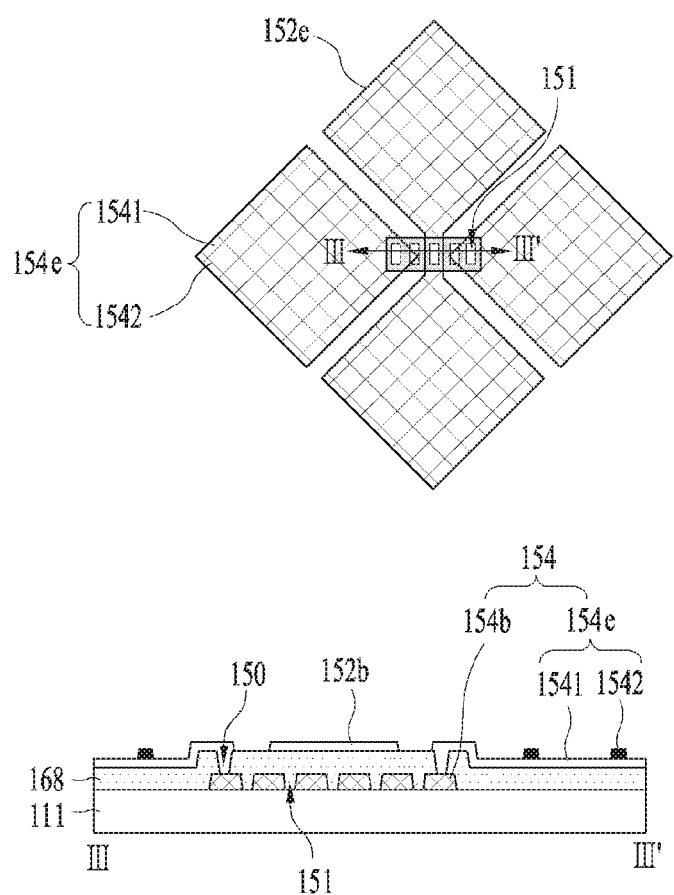
FIG. 9 is a cross-sectional view illustrating an organic light emitting display in accordance with yet another embodiment of the present disclosure.

Further, although the above-described embodiments exemplarily illustrate that the bridges 152b and the first touch electrodes 152e of the touch driving lines 152 are disposed on different planes and then connected through the touch contact holes 150, bridges 154b and second touch electrodes 154e of touch sensing lines 154 may be disposed on different planes and then connected through touch contact holes 150, as exemplarily shown in FIG. 9. Further, although the present invention exemplarily illustrates that the mutual capacitive touch sensors are formed between the touch sensing lines 154 and the touch driving lines 152 intersecting each other, the present invention may be applied to self-capacitive touch sensors formed along touch lines formed in one direction.

Moreover, although the embodiments shown in FIGS. 1, 7 and 8 exemplarily describe that the first and second touch electrodes 152e and 154e of the organic light emitting display are formed of a plate-type transparent conductive film, i.e., the second conductive layer, the first and second touch electrodes 152e and 154e may be formed as a mesh, as exemplarily shown in FIG. 9. That is, each of the first and second touch electrodes 152e and 154e may include a transparent conductive film 1541 and a mesh metal film 1542 formed as a mesh on the upper or lower surface of the transparent conductive layer 1541. Otherwise, each of the touch electrodes 152e and 154e may include a mesh metal film 1542 without a transparent conductive layer 1541, or the transparent conductive layer 1541 may be formed as a mesh without a mesh metal film 1542. Here, the mesh metal film 1542 has higher conductivity than the transparent conductive layer 1541 and may thus form low-resistance electrodes as the touch electrodes 152e and 154e. Thereby, resistances and capacitances of the touch electrodes 152e and 154e are reduced and a time constant RC is reduced, thus improving touch sensitivity. Further, the mesh metal film 1542 has a very thin line width and may thus prevent an aperture ratio and transmittance from being lowered due to the mesh metal film 1542. Further, the bridges 154b disposed on a plane differing from the touch electrodes 154e may be provided with a plurality of slits, as exemplarily shown in FIG. 9. The slit 151 of the at least one of the first and second bridges 152b, 154b overlaps with the other one of the first and second bridges 154b, 152b. Therefore, the bridges 154b provided with the slits 151 may have a smaller area than bridges provided with no slits. Thereby, reflection of external light by the bridges 154b may be reduced and lowering of visibility may be prevented. Such bridges 154b provided with the slits 151 are formed of a transparent conductive film or an opaque conductive film. If the bridges 154b are formed of an opaque conductive film, the bridges 154b overlap the banks 128 and thus prevent lowering of an aperture ratio.

As apparent from the above description, an organic light emitting display having a touch sensor in accordance with the present disclosure includes a compensation film having a flat surface and formed to cover dams and thus minimizes a part generated by the dams, thereby being capable of preventing cut and short-circuit of routing lines. Further, the organic light emitting display in accordance with the present invention disposes touch electrodes directly on an encapsulation unit without an adhesive and thus does not require a separate attachment process, thereby simplifying the overall process and reducing manufacturing costs.

It will be apparent to those skilled in the art that various modifications and variations can be made in the present invention without departing from the scope of the inventions. Thus, it is intended that the present invention covers the modifications and variations of this invention provided they come within the scope of the appended claims and their equivalents.

What is claimed is:

1. A display apparatus comprising:
light emitting elements arranged on an active area of a substrate;
touch pads arranged on a pad area of the substrate;
at least one dam surrounding the active area and arranged between the active area and the pad area;
an encapsulation unit arranged on the light emitting elements, the encapsulation unit including a first inorganic encapsulation layer, an organic encapsulation layer on the first inorganic encapsulation layer, and a second inorganic encapsulation layer on the organic encapsulation layer and the at least one dam;
touch sensors arranged on the encapsulation unit;
routing lines provided to conductively connect the touch sensors to the touch pads, the routing lines disposed on the second inorganic encapsulation layer and the at least one dam such that the routing lines overlap the second inorganic encapsulation layer and the at least one dam;
a compensation film arranged between the second inorganic encapsulation layer of the encapsulation unit and the routing lines, the compensation film overlapping the at least one dam,
wherein a first region of the compensation film that overlaps the at least one dam has a first thicknesses and a second region of the compensation film that is non-overlapping with the at least one dam and disposed between the light emitting elements and the at least one dam has a second thickness that is different from the first thickness.

2. The display apparatus according to claim 1, further comprising a plurality of color filters arranged between the touch sensors and the encapsulation unit.

3. The display apparatus according to claim 2, wherein the compensation film has a monolayer or multilayer structure using a same material as at least one of the plurality of color filters.

4. The display apparatus according to claim 2, further comprising:
the plurality of color filters to implement light of different colors; and
a black matrix arranged between the plurality of color filters,
wherein the compensation film comprises:
a first compensation film layer formed of a same material as the black matrix; and
a second compensation film layer formed of a same material as at least one of the plurality of color filters and arranged on the first compensation film layer.

5. The display apparatus according to claim 4, further comprising:

a touch buffer film arranged between the plurality of color filters and the touch sensors, wherein the compensation film further comprises:

a third compensation film layer formed of a same material as the touch buffer film and arranged on the second compensation film layer .

6. The display apparatus according to claim 2, further comprising:

a touch buffer film arranged between the touch sensors and the encapsulation unit;

a black matrix arranged between the color filters, wherein the compensation film is formed of a same film as at least one of the plurality of color filters, the black matrix, the touch buffer film or the organic encapsulation layer of the encapsulation unit .

7. The display apparatus according to claim 6, wherein a thickness of the compensation film, formed of the same film as the at least one of the plurality of color filters, the black matrix, the touch buffer film or the organic encapsulation layer of the encapsulation unit, in a region above at least one of the at least one dam is less than a thickness of the compensation film in the region between the at least one dam and the light emitting elements.

8. The display apparatus according to claim 1, further comprising a touch buffer film arranged between the touch sensors and the encapsulation unit, wherein the compensation film is formed of a same film as at least one of the touch buffer film, and the compensation film is formed integrally with the touch buffer film.

9. The display apparatus according to claim 8, wherein the first is less than the second thickness.

10. The display apparatus according to claim 1, wherein:

the routing lines intersect the at least one dam with the compensation film interposed therebetween; and the routing lines are arranged in the region above the at least one dam and in the region between the at least one dam and the light emitting elements, the routing lines are arranged so as to cover a side surface of the compensation film; and the routing lines contact the compensation film.

11. The display apparatus according to claim 1, wherein the touch sensors comprise:

first touch electrodes arranged in a first direction on the encapsulation unit and connected to each other through first bridges; and second touch electrodes arranged in a second direction on the encapsulation unit and connected to each other through second bridges, at least one of the first touch electrodes or the second touch electrodes comprises a mesh metal film formed as a mesh, and transparent conductive layer arranged on an upper and lower surface of the mesh metal film.

12. The display apparatus according to claim 11, wherein at least one of the first bridges or the second bridges has slits, the slits of the at least one of the first bridges or the second bridges overlap other ones of the first bridges and the second bridges, at least one of the first bridges or the second bridges is formed to have a monolayer or multilayer structure using at least one selected from the group consisting of aluminum, titanium, copper, and molybdenum , and at least one of the first bridges or the second bridges is arranged at a position corresponding to a bank provided to prepare an emission region of the light emitting elements.

13. The display apparatus according to claim 11, wherein each of the touch pads comprises a pad electrode arranged on a same layer as a source electrode and a drain electrode of a thin film transistor, wherein each of the touch pads further comprises a pad cover electrode arranged on the pad electrode.

14. The display apparatus according to claim 13, wherein:

the pad electrodes are formed of a same material as at least one of the routing lines and are connected to the routing lines;

the pad cover electrodes are formed of a same material as at least one of the first touch electrodes or the second touch electrodes; and one of the pad electrodes and the pad cover electrodes is formed to have a monolayer or multilayer structure using at least one selected from the group consisting of aluminum, titanium, copper, and molybdenum.

15. The display apparatus according to claim 1, wherein the compensation film is arranged between the touch pads and the organic encapsulation layer of the encapsulation unit and fills spaces between the at least one dam or at least a part of a space between the organic encapsulation layer of the encapsulation unit and the at least one dam.

* * * * *